United States Patent [19]
Gowni et al.

[11] Patent Number: 5,963,487
[45] Date of Patent: Oct. 5, 1999

[54] WRITE ENABLING CIRCUITRY FOR A SEMICONDUCTOR MEMORY

[75] Inventors: Shiva P. Gowni, San Jose, Calif.; Sudhir S. Moharir; Sanjay Sancheti, both of Starkville, Miss.

[73] Assignee: Cypress Semiconductor Corp., San Jose, Calif.

[21] Appl. No.: 08/991,231

[22] Filed: Dec. 16, 1997

[51] Int. Cl.$^6$ .................................................. G11C 7/00
[52] U.S. Cl. ...................... 365/194; 365/230.06; 365/233
[58] Field of Search ............................... 365/194, 230.06, 365/233, 191; 326/82, 86, 92, 104

[56] References Cited

U.S. PATENT DOCUMENTS

| | | | |
|---|---|---|---|
| 5,724,287 | 3/1998 | Takenaka | 365/194 |
| 5,815,463 | 9/1998 | Shih | 365/194 |
| 5,818,767 | 10/1998 | Kim et al. | 365/194 |

*Primary Examiner*—Vu A. Le
*Attorney, Agent, or Firm*—Christopher P. Maiorana, P.C.

[57] ABSTRACT

A write control circuit for a semiconductor memory device includes a conventional write path responsive to a control input (e.g., an external write enable signal) to control the beginning of a write operation for a write driver, whilst a separate dedicated write disable path, responsive to the same control input, controls the end of the write operation for the write driver. The invention separates the end of write from the beginning of write by introducing a fast dedicated path designed primarily for ending the write. This dedicated path contains dedicated logic to generate an end of write signal at the disabling edge of the control input to disable the write driver quickly before a new memory cell is selected.

10 Claims, 5 Drawing Sheets

WRITE ENABLING CIRCUITRY FOR A SEMICONDUCTOR MEMORY

FIELD OF THE INVENTION

The present invention relates to an improved write enabling circuit for a semiconductor memory device and in particular, to an improved method of ending a write operation.

BACKGROUND TO THE INVENTION

A conventional write driver for a semiconductor memory device writes data to a selected memory cell location whenever a write enable pulse is low. The write driver is subsequently disabled by the rising edge of the write enable pulse to end the write. It is important that the write driver is disabled before the next address becomes valid to prevent old data being written to the newly selected memory cell.

Address hold time is the period that the address has to stay valid after end of write. This parameter is determined by a race between the fastest selecting address path and the slowest path to end of write. End of write occurs when the bitlines are raised above the write level of the cells. If the next address is enabled too quickly, the data may be written to that address. Data hold time is the period that the user must hold data valid after end of write. If valid data ends too soon, invalid data will be written into the cell. Another write parameter is the write pulse width which is the minimum write enable pulse required to write data into a memory cell. This parameter determined by how fast the write enabling circuit connects the data input drivers to the internal data bus to write into memory. This parameter is also governed by how fast the write operation is stopped.

For a write operation ended using a write enable signal (e.g., Web) or other similar control signal, the control path is designed to achieve the required address hold time which delays the beginning of write. It is not possible to adjust beginning of write and end of write independently, and it is difficult to meet data hold time without the risk of writing to a wrong address.

SUMMARY OF THE INVENTION

A first aspect of the present invention concerns a write control circuit for a semiconductor memory device, comprising:
 a write enable path responsive to a control input to generate an output signal for controlling the beginning of a write operation; and,
 a separate write disable path responsive to said control input to generate an output signal for controlling the end of said write operation.

Preferably, the write enable path comprises a logic circuit which is responsive to a first logic transition of the control input and the write disable path comprises a logic circuit which is responsive to a second logic transition of the control input.

Preferably, the write control circuit further comprises a logic circuit configured to generate a write control signal from the output signal from the write enable path and the output signal from the write disable path.

Preferably, the logic circuit for generating the write control signal comprises a NOR gate.

Preferably, the write control circuit further comprises a write driver circuit which is responsive to the write control signal.

The control input may be an externally generated write enable signal (e.g., Web), a chip select signal or any other equivalent signal.

A second aspect of the present invention concerns a semiconductor memory device, comprising:
 a first write control circuit according to the first aspect of the present invention for controlling a write operation for data having a first logic level;
 a second write control circuit according to the first aspect of the present invention for controlling a write operation for data having a second logic level; and,
 a write driver circuit responsive to a write control output from the first write control circuit and a write control output from the second write control circuit to write data into a selected location in the memory device.

Preferably, the semiconductor memory device further comprises a plane control circuit configured to generate a plane select signal in response to a memory address location wherein the write driver circuit is configured to write data to a selected memory plane in the semiconductor memory device in response to the plane select signal.

Preferably, the write driver circuit comprises a logic circuit having:
 a first select circuit configured to write data to (i) a first memory plane in the semiconductor memory device in response to an output from the first write control circuit and a first plane select signal, and (ii) a second memory plane in response to the output from the first write control circuit and a second plane select signal; and,
 a second select circuit configured to write data to (iii) the first memory plane in response to an output from the second write control circuit and the first plane select signal, and (iv) the second memory plane in response to an output from the second write control circuit and the second plane select signal.

A third aspect of the present invention concerns a method of writing data into a semiconductor memory device, comprising the steps of:
 transmitting a beginning of write signal along a first path in response to a first logic transition of a control signal; and,
 transmitting an end of write signal along a second, independent path in response to a second logic transition of the control signal.

Preferably, the method further comprises the step of generating a write control signal in response to the beginning of write signal and the end of write signal. The control signal input to the first (e.g., write enable) path and to the second (e.g., write disable) path may be an externally generated write enable signal, a chip select signal or any other equivalent signal.

In the present invention, the write control circuit may include a conventional write path responsive to an external control input to control the beginning of write operation for a write driver, whilst a separate dedicated write disable path, responsive to the same control input, controls the end of write operation. The circuit separates the end of write operation from the beginning of write operation by introducing a fast dedicated path designed primarily for ending the write. This dedicated path contains dedicated logic to generate an end of write signal at the disabling edge of the external control input to disable the write driver quickly and in a highly controllable manner before a new memory cell is selected.

BRIEF DESCRIPTION OF DRAWINGS

Examples of the present invention will now be described with reference to the accompanying drawings, in which.

DETAILED DESCRIPTION

Figure 1:
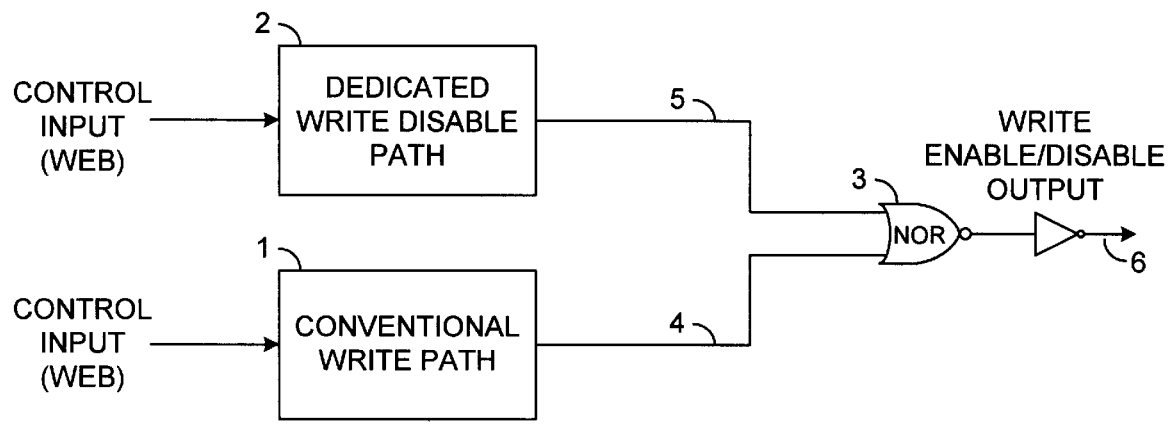
FIG. 1 is a block diagram of part of a write control circuit for a semiconductor memory device which includes a dedicated write disable path.

FIG. 1 shows a schematic block diagram illustrating part of a write control circuit for a semiconductor memory device (not shown). The write control circuitry includes a conventional write path 1 responsive to an external control input (Web) to control the beginning of write for a write diver (not shown), whilst a separate dedicated write disable path 2, responsible to the same control input (Web), control the end of write.

The circuit shown in FIG. 1 separates the end of write by introducing a fast dedicated path 2 designed primarily for ending the write. This dedicated path contains dedicated logic to generate an end of write signal at the disabling edge of the external control input (Web) to disable the write driver quickly before a new memory cell is selected.

NOR gate 3 combines the outputs 4 and 5 of the conventional write path 1 and the dedicated disable path 2, respectively, so that when the external write enable signal (Web) goes low at beginning of write, the output 6 goes low. (Naturally, any combination of transistors or logic gates providing an OR-type logic function may replace the NOR gate inverter combination of FIG. 1). When the external write enable signal (Web) goes high again, signalling end of write, there is an unavoidable delay introduced in the conventional write path 1 which, in the absence of the dedicated write disable path 2, would delay the end of write. However, the dedicated write disable path 2 with its associated level shifters and control circuits (not shown) is loaded much less heavily than the conventional write path 1 and therefore responds much more quickly to present a logic high to the associated input of the NOR gate 3 so that the output 6 goes high within the allowed time constraints of the system.

Figure 2:
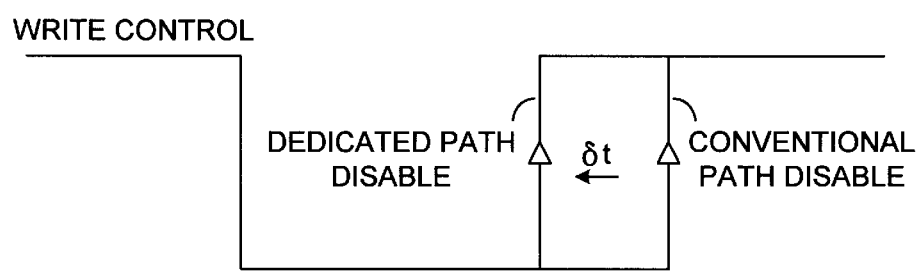
FIG. 2 illustrates the response of the dedicated write disable path shown in FIG. 1 in comparison to a conventional write path.
Figure 2:
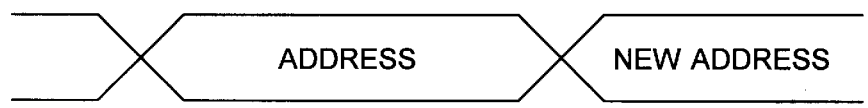

The end of write signal generated by the dedicated write disable path 2 appears at the associated input to the NOR gate 3 at some time to before the end of write signal generated by the conventional write path 1, thereby ensuring that the write driver (not shown) is disabled before the next address becomes valid. This is shown in FIG. 2. Typically, the time δt is in the order of 200 ps or more.

Figure 3:
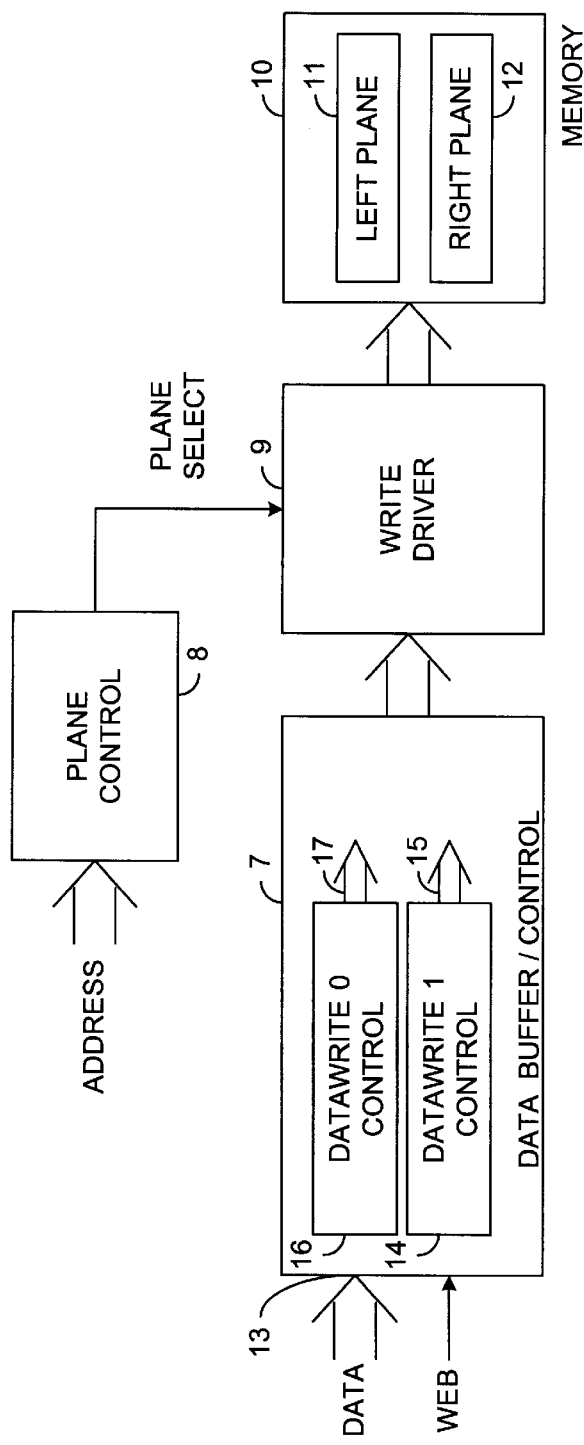
FIG. 3 is a schematic block diagram of a semiconductor memory device which includes the write enable circuit of FIG. 1.

FIG. 3 shows an example of a semiconductor memory device comprising a data buffer/control circuit 7 and a plane control circuit 8 for controlling a write driver 9 connected to a memory device 10 (e.g., a random access memory) which is divided into left and right planes 11 and 12, respectively. Of course, there may be more than two planes (e.g. $2n$ or $2^n$, where n is an integer>1), and one may substitute blocks, subarrays or an equivalent arrangement of memory cells for the memory planes in the present example. The data buffer/control circuit 7 is responsive to a data input (e.g., DATA) and a write enable input to write either logical "1"s (datawrite1) or logical "0"s (datawrite0) into the selected memory plane. As will be described in detail below, the plane control circuit 8 is responsive to an address input (e.g., ADDRESS) to ensure that the write driver 9 selects the appropriate plane for a memory location given by an address.

Each of control circuit 16 (identified as "DATAWRITE0" in FIG. 3) and control circuit 14 (identified as "DATAWRITE1" in FIG. 3) represents a combination of the conventional write path 1 and the dedicated write disable path as shown in FIG. 1. Control circuit 16 is particularly configured to enable and subsequently disable writing a LOW data level (e.g., a logic "0") in memory 10. Control circuit 14 is particularly configured to enable and subsequently disable writing a HIGH data level (e.g., a logic "1") in memory 10.

Figure 4:
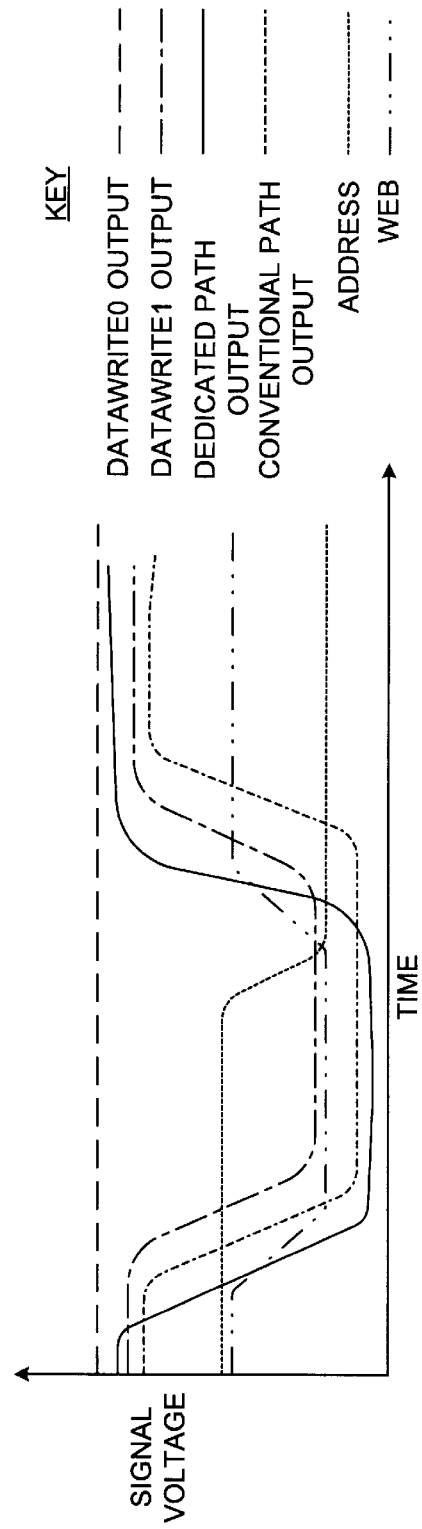
FIG. 4 is a graph illustrating a data write operation for the device of FIG. 3.

The operation of the circuit in FIG. 3 will now be described with reference to the graph shown in FIG. 4. In this example, data at an input 13 to the data buffer/control circuit 7 is high. When the external write enable signal (Web) goes low for a valid address, the outputs of both the conventional write path 1 and the dedicated write disable path 2 within the datawrite1 control circuit 14 go low, thereby allowing data to be written to the selected cell in the memory 10 via an output 15 of the datawrite1 control circuit 14. When the write enable signal rises to signal end of write, the output 5 of the dedicated write path 2 goes high some time δt before the output 15 of the conventional write path, whereupon the output 15 of the datawrite1 control circuit 14 goes high to end the write operation. In one embodiment, the output 5 of the dedicated write disable path 2 goes high following the rising transition of the write enable signal on the order of 200 ps before the output 4 of the conventional write path 1, thereby allowing the present write enable circuit to meet shorter or more stringent address hold times and data hole times for the semiconductor memory 10 than those achievable with a conventional write path alone.

Figure 5:
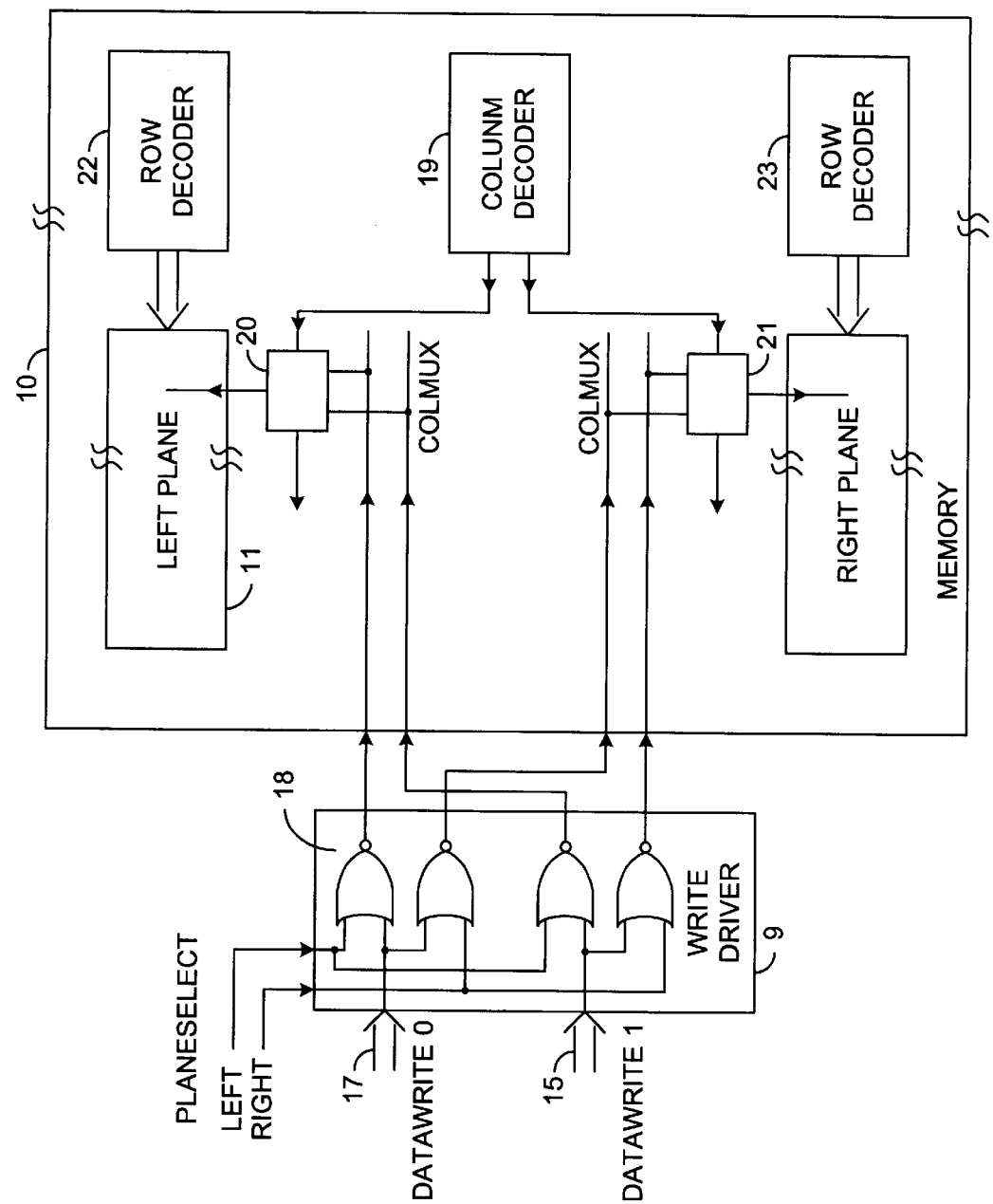
FIG. 5 shows the write driver and semiconductor memory of FIG. 3 in more detail.

FIG. 5 shows the write driver 9 and semiconductor memory 10 of FIG. 3 in more detail. The write driver 9 receives inputs 15 and 17 from the datawrite0 and datawrite1 control circuits 14 and 16, respectively, and plan select signals (e.g., LEFT and RIGHT) from the plane control circuit 8 of FIG. 3. The write driver 9 includes plane control write logic comprising a series of NAND logic gate circuits 18 (or their logic equivalents) which combine these inputs for writing data to a selected memory cell in one of the two planes 11 and 12 determined by the plane control circuit 8 from the address. The memory cell to be written is determined from the address using a column decoder 19 with associated column multiplexers 20 and 21 and a pair of row decoders 22 and 23, one for each of the two memory planes 11 and 12, in the usual manner.

Each of the left plane 11 and right plane 12 comprises an array or subarray of memory cells. It may be possible to write into a cell only if the plane control input (e.g., LEFT or RIGHT) is active (e.g., a high logic level). In the present invention, the write driver is responsive to the plane select inputs to select only one of the two planes 11 and 12 at any instant so that there is not unnecessary switching associated with the deselected plane. This design reduces current consumption and related noise.

Figure 6:
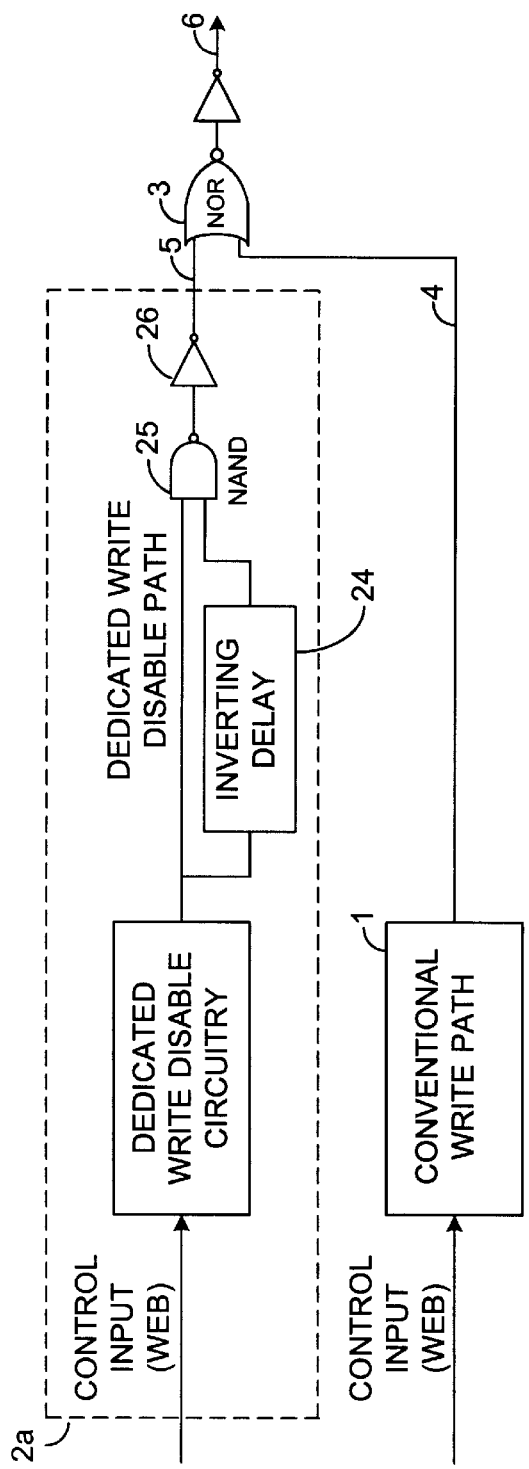
FIG. 6 shows a modification to the dedicated path write disable logic of FIG. 1.
Figure 7:
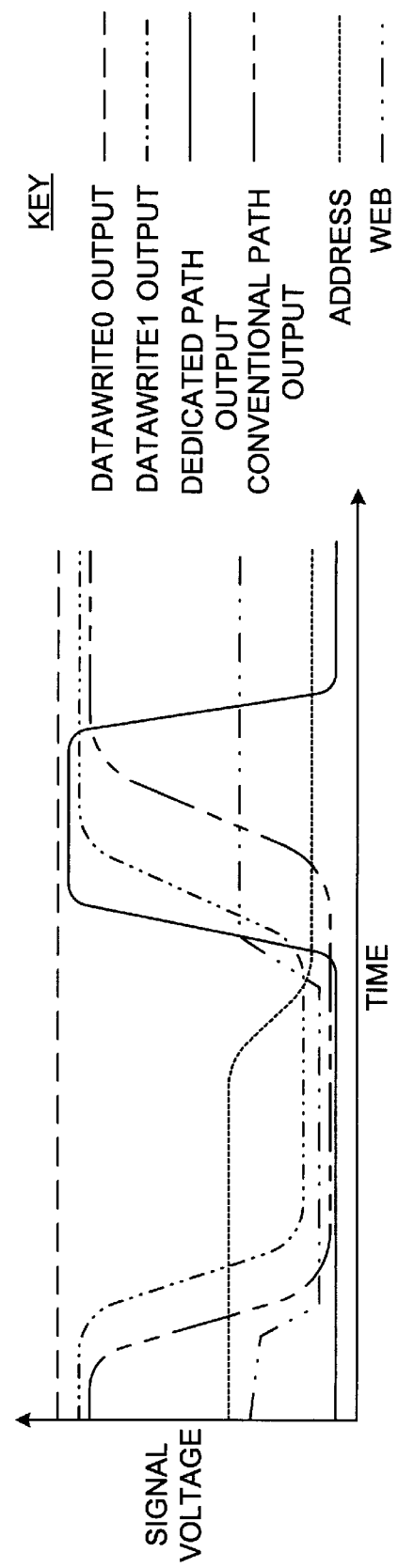
FIG. 7 is a graph illustrating a data write operation for the device of FIG. 6.

FIG. 6 shows a modification to the dedicated path write disable logic of FIG. 1. The write disable path 2a includes some additional logic, namely an inverting delay logic path 24 and an AND-type logic circuit (e.g., NAND gate 25 and inventor 26) to change the output of the circuit to a pulse, as is shown in FIG. 7. In this example, the dedicated path output 5 remains low until the control input (web) goes high, and then remains high until the signal at the output of the inverting delay path 24 changes. Accordingly, in this design, beginning of write is controlled solely by the conventional write path 1.

Figure 8:
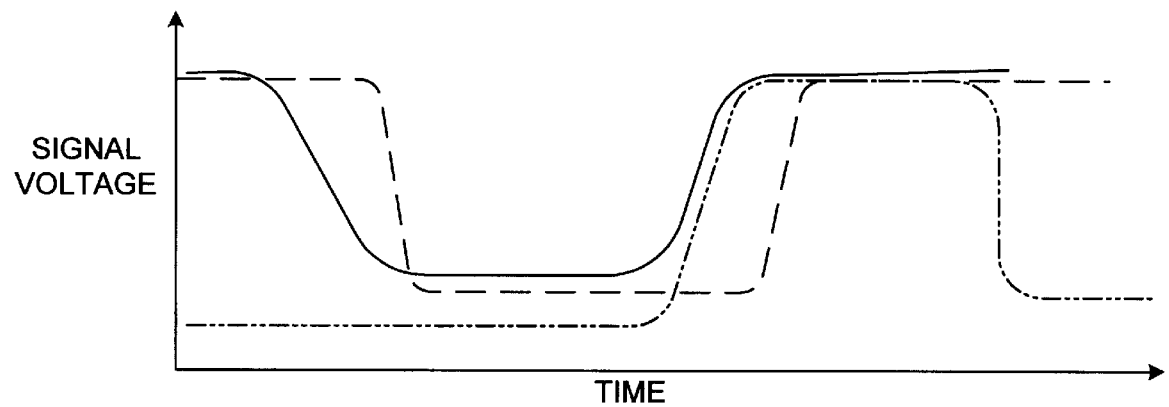
FIG. 8 is a graph comparing the response of the dedicated path write disable logic of FIG. 6 with that of FIG. 1.

FIG. 8 illustrates the difference between the outputs 6 and 5 of the dedicated write disable paths of FIGS. 1 and 6, respectively.

We claim:

1. A write control circuit, comprising:

a write enable path comprising a first logic circuit responsive to a first logic transition of a control input to generate a first output signal for controlling the beginning of a write operation; and, a separate write disable path comprising a second logic circuit responsive to a second logic transition of said control input to generate a second output signal for controlling the end of said write operation.

2. A write control circuit according to claim 1, further comprising a logic circuit configured to combine the first output signal with the second output signal to generate a write control signal.

3. A write control circuit according to claim 2, in which said logic circuit for generating the write control signal comprises an OR-type logic gate.

4. A write control circuit according to claim 2, further comprising a write driver circuit responsive to the write control signal.

5. A semiconductor memory device comprising:

a first write control circuit according to claim 1 configured to enable and disable writing data having a first logic level;

a second write control circuit according to claim 1 configured to enable and disable writing data having a second logic level; and, a write driver circuit responsive to an output from the first write control circuit and an output from the second write control circuit to write data into a selected location in the memory device.

6. A semiconductor memory device according to claim 5, further comprising a subarray control circuit configured to generate a subarray select signal in response to a memory address, the write driver circuit writing data to a subarray of the semiconductor memory device in response to said subarray select signal.

7. A semiconductor memory device according to claim 5, in which the write driver circuit comprises a first subarray driver configured to write data to (i) a first memory subarray in response to an output from the first write control circuit and a first subarray select signal, and to (ii) a second memory subarray in response to an output from the first write control circuit and a second subarray select signal.

8. A semiconductor memory device according to claim 7, in which the write driver circuit further comprises a second subarray driver configured to write data to (i) said first memory plane in response to an output from the second write control circuit and said first plane select signal, and to (ii) said second memory plane in response to the output from the second write control circuit and said second plane select signal.

9. A method of writing data into a semiconductor memory device comprising the steps of:

generating a first output signal for controlling the beginning of a write operation in response to a first logic transition of a control signal; and generating a second output signal for controlling an end of write operation in response to a second logic transition of the control signal.

10. A method according to claim 9, further comprising the step of generating a write control signal in response to the first and second output signals.

* * * * *